United States Patent
Chang

[19]

[11] Patent Number: 6,079,638
[45] Date of Patent: Jun. 27, 2000

[54] NOZZLE ASSEMBLY IMPROVEMENT

[76] Inventor: Sei-Chang Chang, 2F, No. 3, Aly. 10, Ln. 304, An Leh Rd., YungHo, Taipei, Taiwan

[21] Appl. No.: 09/119,212

[22] Filed: Jul. 20, 1998

[51] Int. Cl.[7] .................................................. A62C 31/02
[52] U.S. Cl. ......................... 239/390; 239/600; 239/550; 239/587.1; 285/360
[58] Field of Search ..................... 239/600, 390, 239/550, 587.1, 568, 597, 487; 285/360, 361, 376, 396, 401, 402

[56] References Cited

U.S. PATENT DOCUMENTS

| | | | |
|---|---|---|---|
| 4,738,401 | 4/1988 | Filicicchia | 239/487 |
| 4,915,305 | 4/1990 | O'Brien et al. | 239/600 |
| 5,333,790 | 8/1994 | Christopher | 239/600 |
| 5,421,522 | 6/1995 | Bowen | 239/600 |
| 5,487,507 | 1/1996 | McDonald et al. | 239/600 |
| 5,564,448 | 10/1996 | Lincoln | 239/550 |
| 5,799,988 | 9/1998 | Yeh | 285/360 |

*Primary Examiner*—Andres Kashnikow
*Assistant Examiner*—Dinh Q. Nguyen
*Attorney, Agent, or Firm*—W. Wayne Liauh

[57] ABSTRACT

An improvement for nozzle assembly for resolving the problem of fixed spraying angle of conventional nozzle assemblies. The nozzle assembly of the present invention includes a nozzle insert engageable with a nozzle body, and a cylindrical rubber washer set between them for sealing and enhancing the engagement. The nozzle insert has at least one lug with a semi-spherical bulge located thereon. The nozzle body has at least a locking bridge with a plurality of concave notches formed therein. Turning the nozzle insert, the bulge will engage with one of the notches. Thus the spraying angle is changeable by placing the bulge at different notches. The assembly may be quickly disconnected for maintenance or replacement.

4 Claims, 6 Drawing Sheets

NOZZLE ASSEMBLY IMPROVEMENT

BACKGROUND OF THE INVENTION

1. Field of the Invention

This invention relates to an improvement for nozzle assembly and particularly to a nozzle assembly that can be disconnected quickly and provides multiple selections of spraying angle.

2. Description of the Prior Art

Nozzle assembly is being used widely in spraying painting, gardening, pulp and paper industry and circuit board fabrication. Conventional nozzle assembly usually is screwed directly to the piping system of a fluid source. After using for a period of time, the nozzle could accumulate deposits and gets blocked. It therefore has to be disconnected from the piping system regularly for cleaning, maintenance or replacement. The screw connection making this job difficult and time consuming. Hence some quick disconnect nozzle assembly has been disclosed in the prior art to resolve this problem.

U.S. Pat. No. 5,421,522(Bowen) and U.S. Pat. No. 5,190,224 (Hamilton) are two of the examples. The nozzle assembly of such type generally includes a nozzle insert connecting with a nozzle body which in turns being screwed to a fluid source. The nozzle body is generally not removable. The nozzle insert connects or disconnects with the nozzle body via a locking means which also provides quick disconnect function. A groove is formed at the tip of the nozzle insert so as to produce a particular spray pattern, that means, the spraying angle of the nozzle assembly is determined by the angular and geometric features of the groove. However, there is one drawback of such a feature, i.e., the spraying angle is normally fixed. When there is a need for changing the spraying angle, or the nozzle body has not been properly connected to the fluid source and should be adjusted, the nozzle body has to be disconnected from the fluid source for adjustment. This process is tedious and also time-consuming.

SUMMARY OF THE INVENTION

In view of aforesaid disadvantages, it is therefore an object of this invention to provide an improvement for nozzle assembly that provides not only quick disconnect features but also has multiple spraying angle selection function. It thus further enhances its applicability and convenience.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 1:
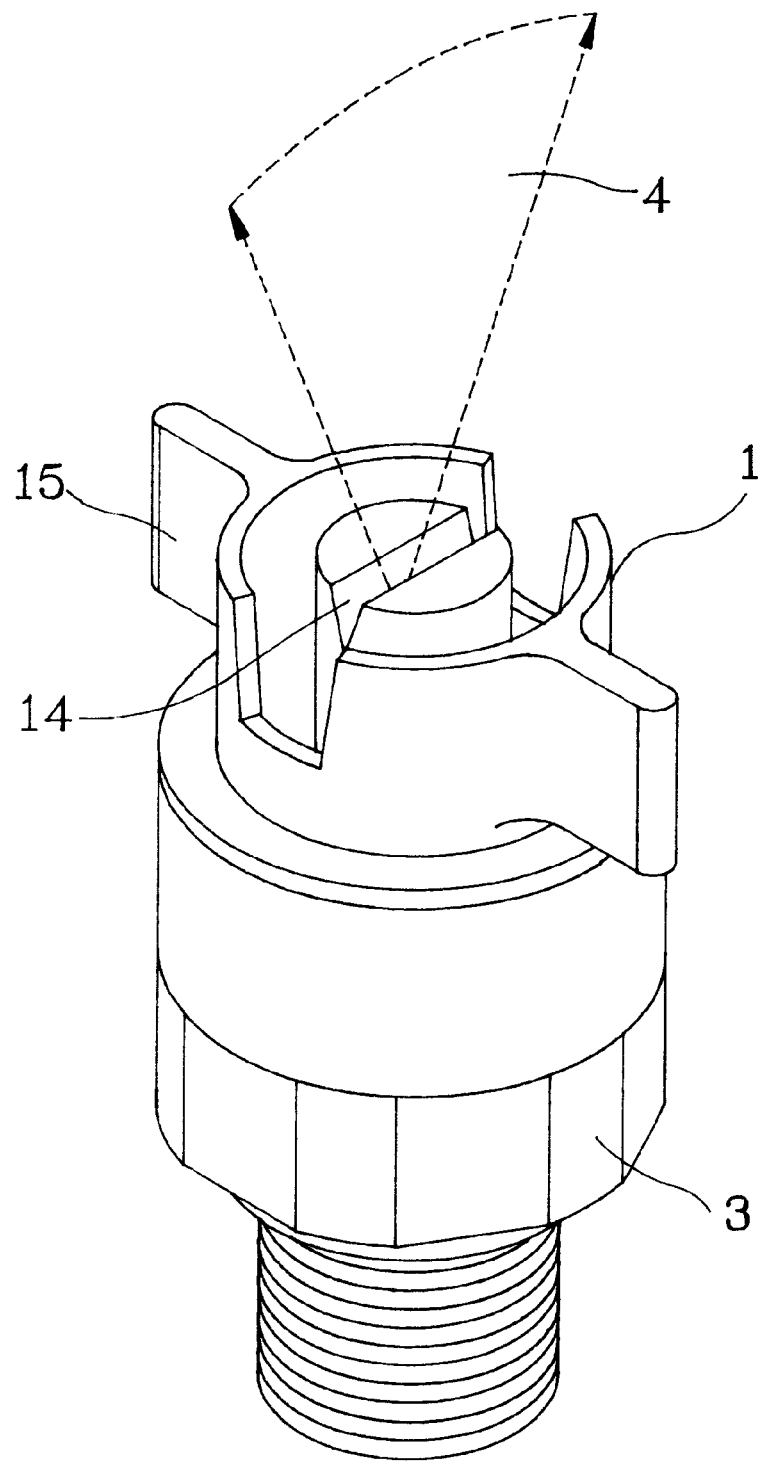
FIG. 1 is a perspective view of this invention.
Figure 2:
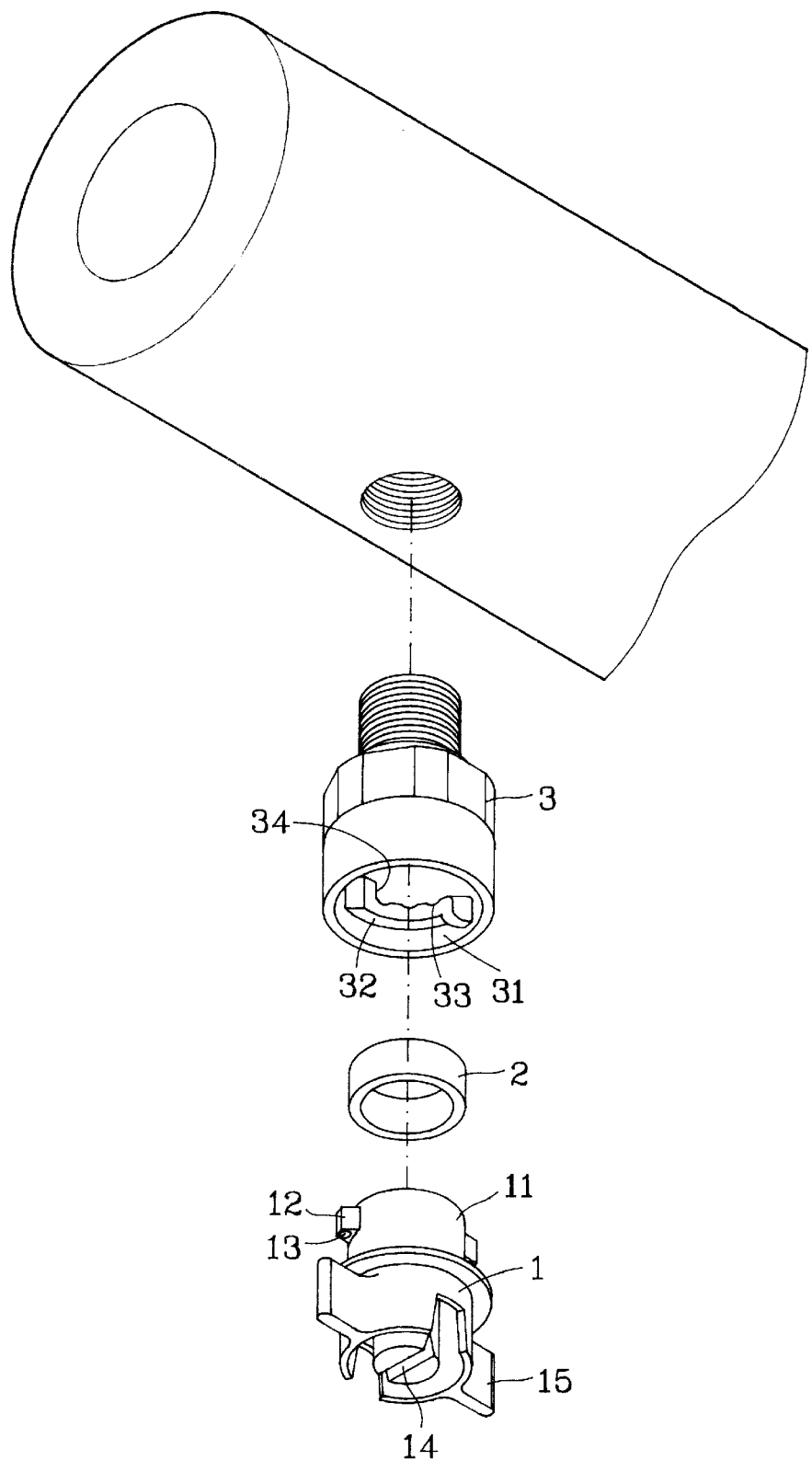
FIG. 2 is an exploded view of this invention.

Referring to FIGS. 1 and 2, a nozzle assembly according to this invention includes a nozzle insert 1, a cylindrical rubber washer 2 and a nozzle body 3. Within the nozzle body 3 there is an inside chamber for housing the rubber washer 2 therein. The nozzle body 3 further has a round bore seat which has an inside larger diameter than the exterior diameter of the nozzle insert 1 for engaging with the nozzle insert 1.

The nozzle insert 1 has two lugs 12 formed on the outside lateral wall 11 at one end. The lugs 12 are opposite to each other. On each lug 12, there is a semispherical bulge 13 disposed thereon at a end opposite to the nozzle body 3. At another end of the nozzle insert 1, there is a wedge-shaped spraying slot 14 formed therein for guiding the spray 4 at an angle, i.e., orientation of the wedge-shaped slot, desired. On an outer rim of the nozzle insert 1 at the end where the spraying slot 14 is formed, there is formed with a pair of handles 15 for turning the nozzle insert 1, and to alter the spraying angle.

The rubber washer 2 is in a cylindrical shape and has a height and a thickness larger than which of a conventional O-ring, and is located in a bottom end of the inside chamber of the nozzle body 3. When the nozzle insert 1 is assembled into the round bore seat of the nozzle body 3, the bottom end of the nozzle insert 1 will compress the cylindrical rubber washer 2. Since the rubber washer 2 is relatively higher and thicker in comparison with the conventional ring-type O-ring, it thus provides much better sealing effect and prevent leakage that might taking place between the nozzle body 3 and the nozzle insert 1. For assembly, placing the rubber washer 2 into the nozzle body 3, then pushes the nozzle insert 1 having one end thereof compressing the rubber washer 2 and turns the nozzle insert 1 to engage with the nozzle body 3 tightly.

On an inside lateral wall 31 of the nozzle body 3, there are at least one pair of curved shape locking bridges 32 attached thereon. The locking bridges 32 are apart from each other such that gaps are formed between the locking bridges 32 for the lugs 12 to pass through when the nozzle insert 1 is assembled with the nozzle body 3. Each locking bridge 32 has a plurality of concave notches 33 formed thereat. When the nozzle insert 1 is pushed into the nozzle body 3, passing the lugs 12 through the gaps between the locking bridges 32, the nozzle insert 1 is then rotated by a desired degree so that the bulge 32 may engage with one of the notches 33. With the help of the rubber washer 2, the bulge 32 will tightly engage with the notch 33. Therefore the nozzle insert 1 and the nozzle body 3 forms a tightly engagement without leaking. At one end of the locking bridge 32, there is a stopper 34 to set the limit of the lug 12 rotation. On the locking bridge 32 at an end opposite to the stopper 34, a guiding block is formed thereon.

The guiding block is extended toward an open end of the round bore seat of the nozzle body 3 (i.e., facing the nozzle insert 1) such that when the nozzle insert 1 is put to mate with the nozzle body 3, the guiding block guides the bulge 12 to pass through the gap between the bridges 32 for facilitating engagement thereof.

Figure 3:
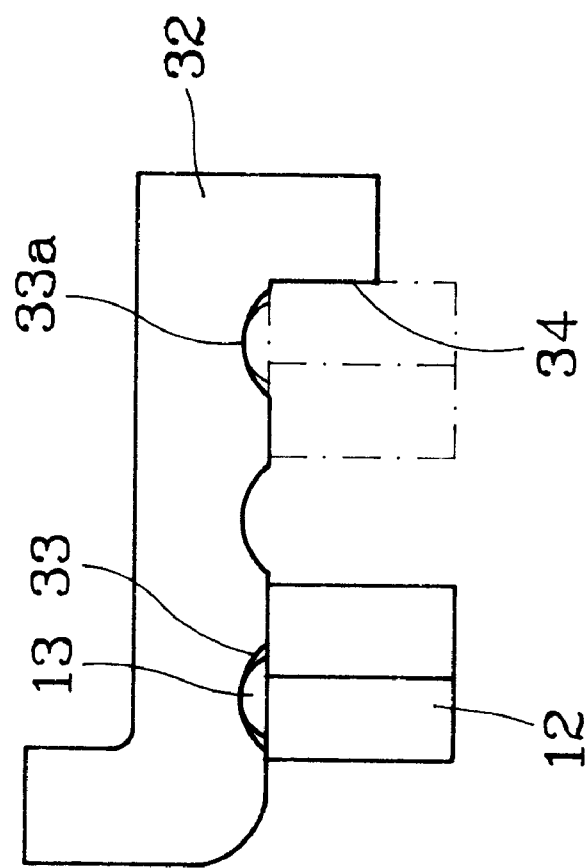
FIG. 3 is a fragmentary side view of a locking means of this invention.

Referring to FIGS. 1 and 3, by turning the handle 15, the bulge 13 may be moved from one notch (e.g., 33) to another notch (e.g., 33a). Then the spraying slot 14 will also be turned angularly. Therefore the spraying angle of the spray 4 may also be changed as desired. The turning angle, direction and stage may be optionally selected based on different number and internal of the notches 33.

In practice, the stopper 34 may be dispensed with and to substantially make the locking bridge 32 a partially annular ring. Then the turning angle may be up to 360 degree clockwise or counterclockwise. The nozzle body may also be made elbow type 5 (as shown in FIG. 4), or buckle type 6 (as shown in FIG. 5), or ball type 7 (shown in FIG. 6).

Figure 4:
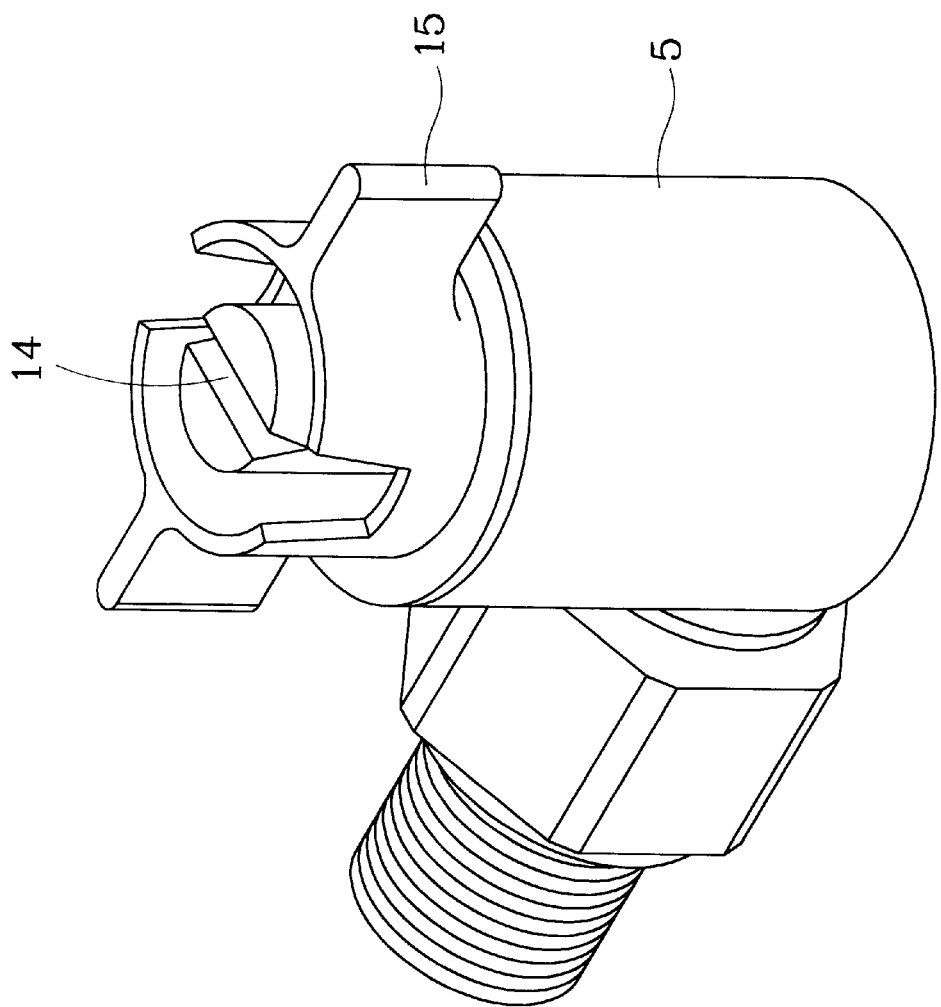
FIG. 4 is a pictorial view of another preferred embodiment in accordance with the present invention.
Figure 5:
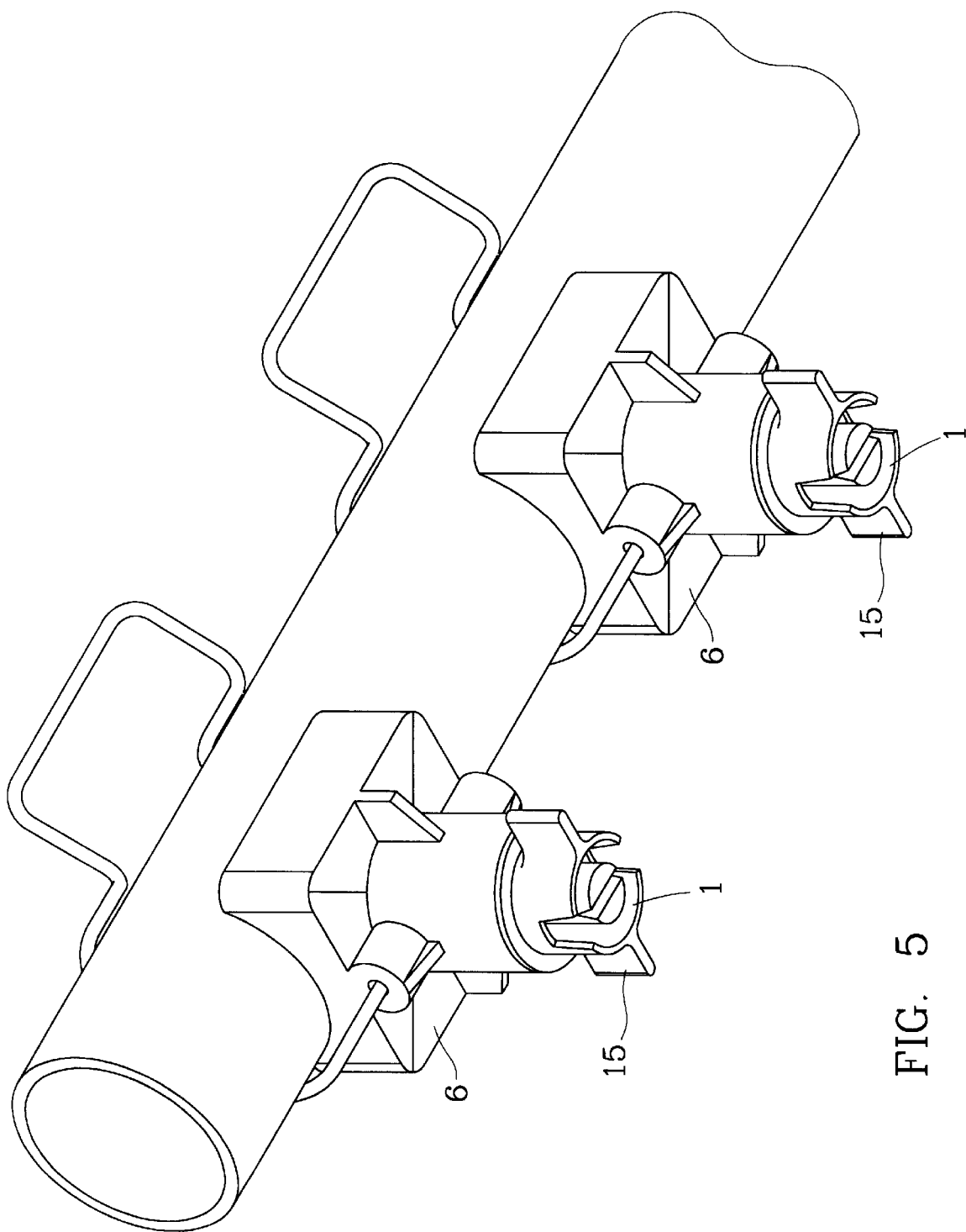
FIG. 5 is another pictorial view of a further embodiment in accordance with the present invention.
Figure 6:
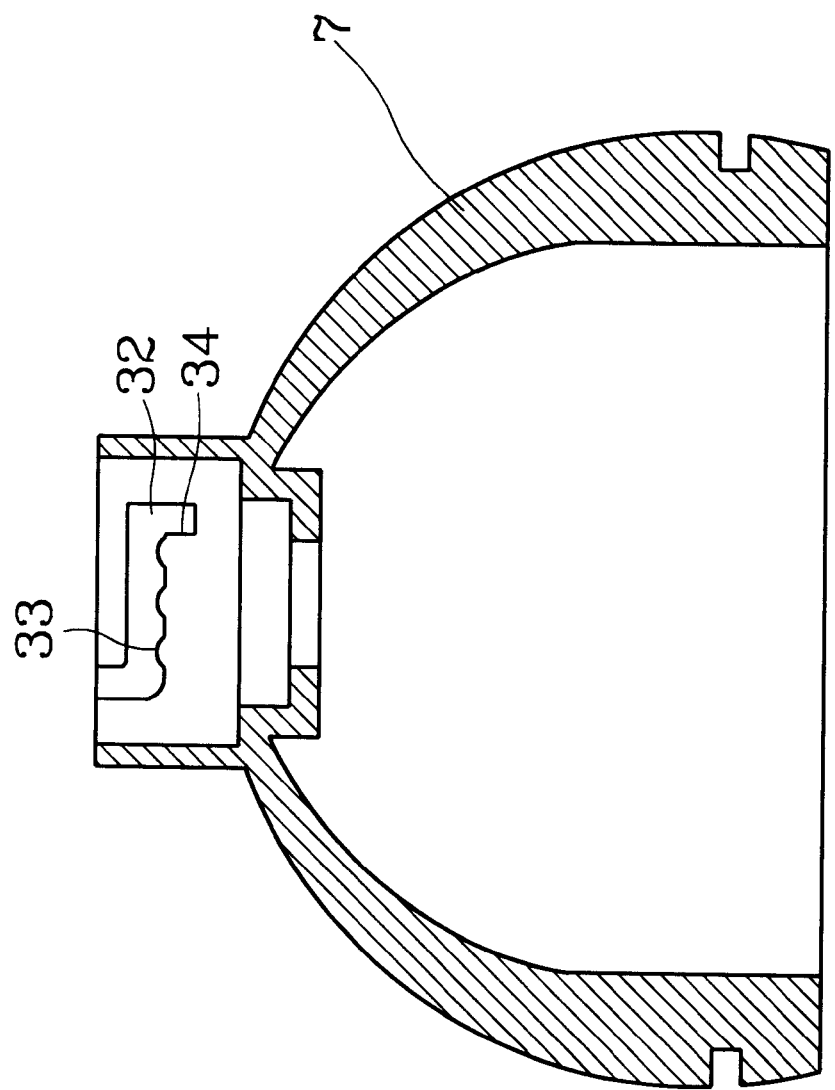
FIG. 6 is a further pictorial view of yet a further embodiment in accordance with the present invention.

FIGS. 4, 5 and 6 show that this invention may be easily and flexibly adapted to other conventional peripheral facilities used in a nozzle spraying system. In summary, this invention offers the advantages of quick disconnect feature and multiple spraying angle selection function not available in other conventional nozzle assemblies.

It may thus be seen that the objects of the present invention set forth herein, as well as those made apparent from the foregoing description, are efficiently attained. While the preferred embodiment of the invention has been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An improvement for a nozzle assembly, comprising:
   a nozzle insert having a wedge-shaped spraying slot formed at an end of the nozzle insert and at least two lugs formed on outside lateral wall thereof, the wedge-shaped spraying slot being oriented along a predetermined direction;
   a nozzle body engageable with the nozzle insert having at least two locking bridges disposed annularly along an inside circumference thereof, the locking bridges being apart from each other such that gaps are formed therebetween for the lugs to pass therethrough when engaging the nozzle insert with the nozzle body, each locking bridge having a plurality of concave notches engageable with the lug so as to allow multiple orientations of the wedged-shaped slot; and
   a cylindrical rubber washer located between the nozzle insert and the nozzle body for providing sealing and keeping the lug engaging tightly with the notches.

2. The improvement for a nozzle assembly of claim 1, wherein the plurality of concave notches are disposed in such a manner so as to allow the direction of the wedged-shaped slot to be changed by engaging the lugs with different set of concave notches.

3. The improvement for a nozzle assembly of claim 1, wherein the nozzle insert further has a handle to facilitate a turning of the nozzle insert.

4. The improvement for a nozzle assembly of claim 1, wherein the locking bridge has a stopper at one end for setting the turning limit of the nozzle insert.

* * * * *